United States Patent [19]

Kagechika et al.

[11] Patent Number: 4,940,522
[45] Date of Patent: Jul. 10, 1990

[54] METHOD FOR MANUFACTURING PLATED STEEL SHEET FOR CANS

[75] Inventors: Hiroshi Kagechika; Tadahiko Mishima; Yoshinori Yomura; Hiroshi Ishikawa; Naoyuki Oniwa; Yoshihiko Yasue, all of Tokyo, Japan

[73] Assignee: NKK Corporation, Tokyo, Japan

[21] Appl. No.: 404,841

[22] Filed: Sep. 8, 1989

Related U.S. Application Data

[62] Division of Ser. No. 281,032, Dec. 7, 1988, Pat. No. 4,897,316.

[30] Foreign Application Priority Data

Dec. 29, 1987 [JP] Japan .................. 62-336859

[51] Int. Cl.$^5$ ............ C23C 14/02; C23C 14/24; C23C 14/34
[52] U.S. Cl. ............ 204/192.1; 204/192.15; 204/192.31; 427/38; 427/39; 427/50; 427/250
[58] Field of Search ............ 204/192.1, 192.11, 192.12, 204/192.15, 192.31; 427/34–39, 45.1, 50, 248.1, 250

[56] References Cited

U.S. PATENT DOCUMENTS 3,205,086  9/1965  Brick et al. .................. 427/172
4,407,149 10/1983  Smith et al. .................. 72/47

FOREIGN PATENT DOCUMENTS 0251759  1/1988  European Pat. Off. .
60-67653  4/1985  Japan .

OTHER PUBLICATIONS

T. Spalvins et al., *Thin Solid Films*, vol. 84, pp. 267–272, (1981).
A. J. Perry, *Thin Solid Films*, vol. 81, pp. 357–366, (1981).
Patent Abstracts of Japan, vol. 4, No. 85(C-15) (567); Jun. 18, 1980.

*Primary Examiner*—Aaron Weisstuch
*Attorney, Agent, or Firm*—Frishauf, Holtz, Goodman & Woodward

[57] ABSTRACT

A method of manufacturing a plated steel sheet for cans which must have a good outer appearance for printing and high image clarity. The method comprises forming a plating layer directly on the surface of a steel sheet having an average central surface roughness of 0.10 μm or less, the plating layer being formed by vacuum deposition. The plating layer is a metal or a metal alloy, has a thickness of from 0.01 to 5 μm, and has a high image clarity.

5 Claims, 1 Drawing Sheet

METHOD FOR MANUFACTURING PLATED STEEL SHEET FOR CANS

This is a division of application Ser. No. 07/281,032 filed Dec. 7, 1988, Pat. No. 4,897,316.

BACKGROUND OF THE INVENTION

1. Field of the Invention

The present invention relates to a method for manufacturing a plated steel sheet used for printed cans such as food cans and drink cans.

2. Description of the Related Art

Cans such as food and drink cans used for canned food or cans used for protecting sweet stuffs or dried goods against humidity are made of a material such as a tin-plated steel sheet, a chromium-plated steel sheet, or an aluminum sheet. Most such cans have printing on their outer surfaces to obtain a good outer appearance. In particular, a demand for cans used for gifts or souvenirs depends on designs, colors, and color tones of the cans. That is, a good outer appearance is important for these cans.

In order to obtain a good outer appearance, a white coating is formed on the surface of a steel sheet to cover a color inherent to a metal sheet so that colors can be painted thereon, or printing is performed on the surface of a steel sheet using a transparent ink to utilize the color or gloss of the metal. In either method, the higher the image clarity of the plated steel sheet surface is, the clearer and more beautiful the printed colors become. Since low image clarity of a steel sheet allows only dark colors, the image clarity on the surface of a steel sheet must be high with any method used.

A conventional plated steel sheet for cans is obtained by forming an electroplated layer on the surface of a steel sheet having a surface roughness Ra (average central roughness) of 0.12 to 3.0 µm. The image clarity of this steel sheet is, however, unsatisfactory. No steel sheet capable of solving this problem has been developed.

As for steel sheets for applications other than cans, e.g., for decoration, bright chromium plating, bright nickel plating, and the like have improved the image clarity of a steel sheet. In these methods, however, a suitable plating condition range is narrow, and complicated treatment steps are required. Therefore, these methods cannot be used for can materials which must be mass-produced at low cost. Japanese Patent Disclosure (Kokai) No. 60-67653 discloses a method in which a paint is coated on a steel sheet to flatten its surface and then a metal is dry-plated thereon. This method is, however, not suited to can materials because electrical welding or mass production cannot be performed.

SUMMARY OF THE INVENTION

It is, therefore, a first object of the present invention to provide a plated steel sheet for cans having high image clarity.

It is a second object of the present invention to provide a plated steel sheet for cans which can be manufactured by simple steps at low cost.

In order to achieve the above objects of the present invention, there is provided a plated steel sheet for cans manufactured by forming plating layer by vacuum deposition on the surface of a steel sheet having an average central surface roughness of 0.10 µm or less.

In this specification, the term "average central surface roughness" means, as defined in JIS B0601, a value of Ra represented by the following equation in units of microns and obtained when a portion of measurement length l is extracted from a roughness curve along its central line and assuming that a central line of the extracted portion is an X axis and a direction of vertical magnification thereof is a Y axis so that the roughness curve is represented by y=f(x):

$$Ra = 1/l \int_0^l |f(X)| dX$$

The measurement length is basically three times or more of the cut-off value.

According to this plated steel sheet, the surface roughness of a steel base sheet is reduced more and flattened more than that of a conventional steel sheet, and a plating layer is formed by vacuum deposition. As a result, a plated steel sheet having high image clarity which cannot be obtained by conventional methods can be manufactured. Therefore, when printing is performed on the surface of this plated steel sheet of the present invention, a good outer appearance can be obtained with high image clarity. In addition, a method of the present invention can manufacture such a plated steel sheet at low cost without complicated manufacturing steps as in a conventional method.

DETAILED DESCRIPTION OF THE PREFERRED EMBODIMENTS

Figure 1:
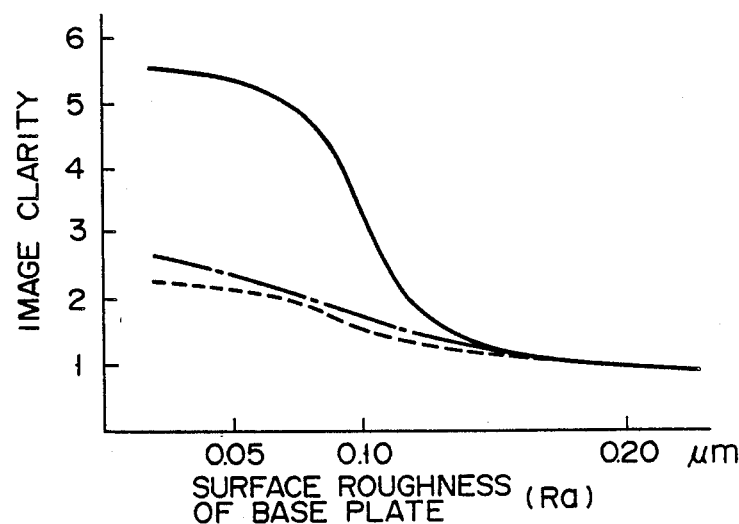
FIG. 1 is a graph showing a relationship between a surface roughness of a steel base sheet and image clarity thereof obtained on the surface of the steel sheet and a plated surface.

In consideration of the fact that, recently, cold rolled steel sheets having less surface roughness can be manufactured as rolling techniques have been developed, the present inventors examined relationships between the surface roughness of a steel base sheet and the roughness on a plated surface, between roughness and gloss, and between gloss and image clarity. As a result of comparing these relationships for base sheets having largely different surface roughnesses, it is found that as the average central surface roughness Ra of the steel sheet is reduced, both the gloss and image clarity are improved. As a result of comparing these relationships for base sheets in which Ra falls within a narrow range, it is found that Ra or the image clarity differs on surfaces having the same brightness. At the same time, a correlation was found between the surface roughness of the base sheet and the image clarity of the plated surface. Therefore, the present inventors further examined the relationship between the type of plating and the image clarity. As a result, it was found that a plated steel sheet obtained by vacuum depositing a flat base sheet has very high image clarity. This relationship is shown in FIG. 1. The image clarity was estimated using a plate having black and white stripes with a predetermined interval therebetween reflected by a test plate for measuring the image clarity and the reflected black and white stripes were observed to check difficulty of discrimination. Assuming that an estimation point of a commercially available mirror was 10 and that of a cold rolled steel sheet having Ra of 0.2 μm was 1, sensitivity was estimated in ten levels in accordance with the difficulty of discrimination. That is, higher estimation points represent higher image clarity. FIG. 1 shows the relationship between the surface roughness and image clarity of a base sheet. In FIG. 1, the broken line represents the image clarity on the surface of a cold rolled steel sheet; an alternate long and short dashed line, the image clarity on the surface of a 0.5-μm thick electroplated layer formed on the steel sheet; and a solid line, the image clarity on the surface of a 1-μm thick vacuum deposition layer formed on the steel sheet. FIG. 1 shows that when the surface roughness Ra of the base sheet is reduced so as to be smaller than 0.1 μm, the image clarity increases rapidly. This phenomenon is more significant on the vacuum deposited surface than on the base sheet surface. In contrast, no such clear relationship is found on the electroplated surface. That is, the image clarity on the plated surface is not significantly improved even when Ra of the base sheet is reduced to be smaller than 0.1 μm.

Figure 3:
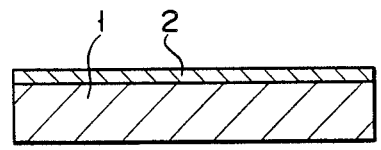
FIG. 3 is a sectional view showing a plated steel sheet of the present invention.

As shown in FIG. 3, a steel sheet of the present invention is obtained by forming dry-plated layer 2 on the surface of steel sheet 1. The steel sheet is preferably an aluminum-killed steel sheet manufactured by FCL-rinsing a steel sheet after cold rolling and then performing refining rolling to adjust the shape and roughness of the resultant steel sheet. Surface roughness Ra of this steel sheet is 0.1 μm or less. A steel sheet having such surface roughness can be easily manufactured by a person of ordinary skill in the art. The surface roughness is measured by a feeler-type roughness meter. This meter feels the surface of an object to be measured in a predetermined direction by a feeler and amplifies the vertical movement of the feeler. According to the steel sheet of the present invention, a dry-plated surface is formed on the surface of the steel sheet by vacuum deposition. The composition of the vacuum deposited surface is not limited to Sn, Cr, Ni or Al conventionally used as a plated steel sheet for cans or can materials or various metals or alloys used as a plating layer in bright electroplating, but may be selected from a wide choice of metals or alloys. If the thickness of the vacuum deposition plating layer of the present invention is less than 0.01 μm, no satisfactory image clarity can be obtained. Although the image clarity increases as the thickness of the plating layer is increased, a thickness exceeding 5 μm is economically not practical. Therefore, the thickness of the plating layer is preferably 0.01 to 5 μm. Forming of the plating layer is performed in a vacuum. More specifically, conventionally used vacuum deposition methods such as chemical vapor deposition, ion plating, vapor deposition and sputtering can be used.

The present invention will be described in more detail by way of an example.

Steel sheets having various surface roughnesses were subjected to vacuum deposition such as vapor deposition, ion plating and electroplating, and the image clarity on each obtained plated surface was checked.

(1) Vapor deposition conditions were as follows:
vacuum degree; $6 \times 10^{-6}$ Torr
temperature of a steel sheet to be plated; 200° C.
plating metal evaporating method;
  electron
  beam
  heating
distance between steel sheet and crucible containing plating metal; 50 cm (2) Ion plating conditions were as follows:
vacuum degree; $6 \times 10^{-6}$ Torr
temperature of steel sheet to be plated; 200° C.
plating metal evaporating method;
  electron
  beam
  heating
distance between steel sheet and crucible containing plating metal; 50 cm
bias voltage; 500 V
ionizing current; 25 V (3) electroplating was Sn plating from a ferrostan bath or Cr plating from a chromic acid bath.

Figure 2:
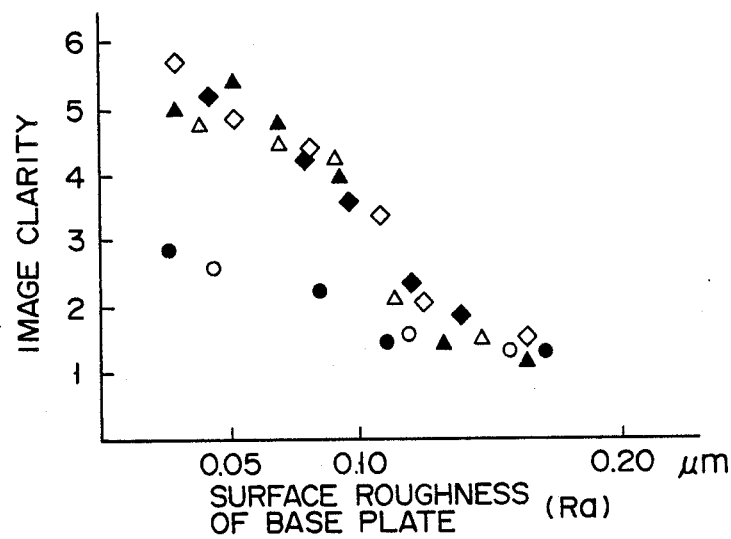
FIG. 2 is a graph in which experimental results obtained in an example of the present invention are plotted.

The results are shown in Table 1 and FIG. 2. In FIG. 2, symbols represent the types of plating as follows:
\ ... vapor deposition of 1.5 μm of Al;
♦ ... ion plating of 0.1 μm of Al;
△ ... vapor deposition of 0.5 μm of Sn;
▲ ... vapor deposition of 0.05 μm Cr;
○ ... electroplating of 0.5 μm of Sn; and
● ... electroplating of 0.5 μm of Cr.

As is apparent from FIG. 2, when the surface roughness Ra of the base sheet of the steel sheet vacuum deposition plated by vapor deposition or ion plating was reduced below 0.1 μm, the image clarity was significantly improved. In the steel sheet electroplated by either Sn plating or Cr plating, however, the image clarity was not improved as much as in the vacuum deposition sheet. Since Ra of a base sheet of a conventional plated steel sheet for cans was 0.12 μm to 3.0 μm, its image clarity was at most 2. In contrast, in the plated steel sheet of the present invention manufactured by performing vacuum deposition of a plating layer on the base sheet having a surface roughness Ra of 0.1 μm or less, the image clarity was significantly improved to 4 to 6.

TABLE 1

| | No. | Roughness of base sheet Ra μm | Plated layer | Thickness of plated layer μm | Plating method | Evaluation of image clarity (average of 3 points) |
|---|---|---|---|---|---|---|
| Present Invention ↓ | 1 | 0.11 | Al | 1.5 | Vacuum deposition | 3.3 |
| | 2 | 0.08 | " | " | Vacuum deposition | 4.3 |
| | 3 | 0.12 | " | " | Vacuum deposition | 2.0 |
| | 4 | 0.05 | " | " | Vacuum deposition | 4.8 |
| | 5 | 0.03 | " | " | Vacuum deposition | 5.7 |
| | 6 | 0.16 | " | " | Vacuum deposition | 1.5 |
| | 7 | 0.04 | " | 0.1 | Ion plating | 5.2 |
| | 8 | 0.08 | " | " | " | 4.0 |
| | 9 | 0.10 | " | " | " | 2.3 |
| | 10 | 0.14 | " | " | " | 2.0 |
| | 11 | 0.09 | " | " | " | 3.5 |
| | 12 | 0.03 | Cr | 0.05 | Vacuum deposition | 5.0 |
| | 13 | 0.05 | " | " | Vacuum deposition | 5.3 |
| | 14 | 0.09 | " | " | Vacuum deposition | 4.0 |
| | 15 | 0.07 | " | " | Vacuum deposition | 4.8 |

TABLE 1-continued

|  | No. | Roughness of base sheet Ra μm | Plated layer | Thickness of plated layer μm | Plating method | Evaluation of image clarity (average of 3 points) |
|---|---|---|---|---|---|---|
|  | 16 | 0.11 | " | " | Vacuum deposition | 2.2 |
|  | 17 | 0.13 | " | " | Vacuum deposition | 1.5 |
|  | 18 | 0.16 | " | " | Vacuum deposition | 1.2 |
|  | 19 | 0.14 | Sn | 0.5 | Vacuum deposition | 1.5 |
|  | 20 | 0.08 | " | " | Vacuum deposition | 4.2 |
|  | 21 | 0.06 | " | " | Vacuum deposition | 4.3 |
|  | 22 | 0.04 | " | " | Vacuum deposition | 4.8 |
| Comparative Example ↓ | 23 | 0.12 | Sn | 0.5 | electroplating | 1.7 |
|  | 24 | 0.15 | " | " | electroplating | 1.3 |
|  | 25 | 0.04 | " | " | electroplating | 2.5 |
|  | 26 | 0.11 | Cr | 0.05 | electroplating | 1.5 |
|  | 27 | 0.17 | " | " | electroplating | 1.3 |
|  | 28 | 0.08 | " | " | electroplating | 2.1 |
|  | 29 | 0.03 | " | " | plating electroplating | 2.8 |

We claim:

1. A method of manufacturing a plated steel sheet for cans, comprising the steps of:
    preparing a steel sheet having a bare surface which has an average central surface roughness of not more than 0.10 μm; and
    performing vacuum deposition directly on the bare surface of said steel sheet to form a plating layer of metal or metal alloy and having a thickness of from 0.01 to 5 μm directly on the surface of said steel sheet, said plating layer having a high image clarity.

2. A method according to claim 1, wherein said step of performing vacuum deposition comprises performing chemical vapor deposition.

3. A method according to claim 1, wherein said step of performing vacuum deposition comprises performing ion plating.

4. A method according to claim 1, wherein said step of performing vacuum deposition comprises performing vapor deposition.

5. A method according to claim 1, wherein said step of performing vacuum deposition comprises performing sputtering.